US012764906B2

(12) United States Patent
Xiao et al.

(10) Patent No.: US 12,764,906 B2
(45) Date of Patent: Oct. 13, 2026

(54) UNIFORM TEMPERATURE PLATE AND ELECTRONIC EQUIPMENT EMPLOYING PLATE

(71) Applicants: CHAMP TECH OPTICAL (FOSHAN) CORPORATION, Foshan (CN); Foxconn Technology Co., Ltd., New Taipei (TW)

(72) Inventors: Ming-Yu Xiao, New Taipei (TW); Cheng-Hui Lin, New Taipei (TW)

(73) Assignees: CHAMP TECH OPTICAL (FOSHAN) CORPORATION, Foshan (CN); Foxconn Technology Co., Ltd., New Taipei (TW)

( * ) Notice: Subject to any disclaimer, the term of this patent is extended or adjusted under 35 U.S.C. 154(b) by 272 days.

(21) Appl. No.: 18/628,750

(22) Filed: Apr. 7, 2024

(65) Prior Publication Data

US 2025/0071944 A1 Feb. 27, 2025

(30) Foreign Application Priority Data

Aug. 24, 2023 (CN) ......................... 202311076230.1

(51) Int. Cl.
*H05K 7/20* (2006.01)
*F28D 15/04* (2006.01)

(52) U.S. Cl.
CPC ....... *H05K 7/20336* (2013.01); *F28D 15/046* (2013.01)

(58) Field of Classification Search
CPC .. H05K 7/20; H05K 7/20309; H05K 7/20318; H05K 7/20336; H05K 7/2039;
(Continued)

(56) References Cited

U.S. PATENT DOCUMENTS

2007/0267179 A1* 11/2007 Hou .................... F28D 15/0233 165/104.26
2010/0319881 A1* 12/2010 Wang .................... H10W 40/73 29/890.032

(Continued)

FOREIGN PATENT DOCUMENTS

CN 203432427 U * 2/2014
KR 20210138333 A * 11/2021 .............. B22F 3/225

OTHER PUBLICATIONS

CN-203432427-U English Translation (Year: 2014).*
KR-20210138333-A English Translation (Year: 2021).*

*Primary Examiner* — Amir A Jalali
(74) *Attorney, Agent, or Firm* — ScienBiziP, P.C.

(57) ABSTRACT

A uniform temperature plate comprises a first plate, a second plate, and a braided wire. The second plate is enclosed with the first plate to form a containing cavity. The containing cavity is filled with working liquid. The containing cavity comprises an evaporation zone and a condensation zone. The braided wire has a capillary structure is arranged in the containing cavity. A first end of the braided wire is arranged in the evaporation zone. A second end of the braided wire is arranged in the condensation zone. Through the capillary structure of the braided wire, the evaporating and re-cooling working liquid can be diverted to the evaporation zone quickly, so as to avoid water accumulated in the uniform temperature plate, improve the reflux efficiency and the temperature uniform performance of the uniform temperature plate. An electronic equipment is also provided.

7 Claims, 7 Drawing Sheets

(58) Field of Classification Search
CPC . H05K 7/20418; F28D 15/00; F28D 15/0233; F28D 15/0266; F28D 15/046; F28F 9/007; F28F 13/003; H10W 40/47; H10W 40/73; G06F 1/20
See application file for complete search history.

(56) References Cited

U.S. PATENT DOCUMENTS

| | | | | |
|---|---|---|---|---|
| 2021/0289669 | A1* | 9/2021 | Yurchenko | H05K 7/20772 |
| 2022/0187025 | A1* | 6/2022 | Xiao | B21C 37/151 |
| 2022/0214115 | A1* | 7/2022 | Liu | F28D 15/02 |
| 2023/0019481 | A1* | 1/2023 | Jin | H05K 7/20336 |
| 2023/0332839 | A1* | 10/2023 | Megaridis | F28D 15/025 |
| 2024/0302108 | A1* | 9/2024 | Wong | F28D 15/046 |
| 2024/0318921 | A1* | 9/2024 | Liu | F28D 15/046 |
| 2025/0107043 | A1* | 3/2025 | Sun | F28D 15/04 |

* cited by examiner

UNIFORM TEMPERATURE PLATE AND ELECTRONIC EQUIPMENT EMPLOYING PLATE

FIELD

The subject matter herein generally relates to heat dissipation technology.

BACKGROUND

Uniform temperature plate is a heat transfer element using the two-phase flow heat exchange principle. The uniform temperature plate is often used in large area of surface to surface heat conduction work, and because of the large contact area of the uniform temperature plate, rapid heat conduction can be achieved.

At present, the capillary structure of the uniform temperature plate is a network structure made of copper mesh or copper powder. After absorbing heat from the heating source, the liquid in the vacuum chamber of the uniform temperature plate evaporates and diffuses in the vacuum chamber, conducting heat to the outside of the chamber, and then condensation into liquid to reflux to the heating source through the capillary structure. The above described evaporation and condensation process, similar to refrigerator and air conditioner, can quickly circulate in the vacuum chamber, which realizes high heat dissipation efficiency. However, water may accumulate in the reflux path of condensed liquid through the capillary structure, such accumulation reduces the reflux efficiency and affects the heat dissipation performance.

BRIEF DESCRIPTION OF THE DRAWINGS

Implementations of the present technology will now be described, by way of example only, with reference to the attached figures.

DETAILED DESCRIPTION

Figure 1:
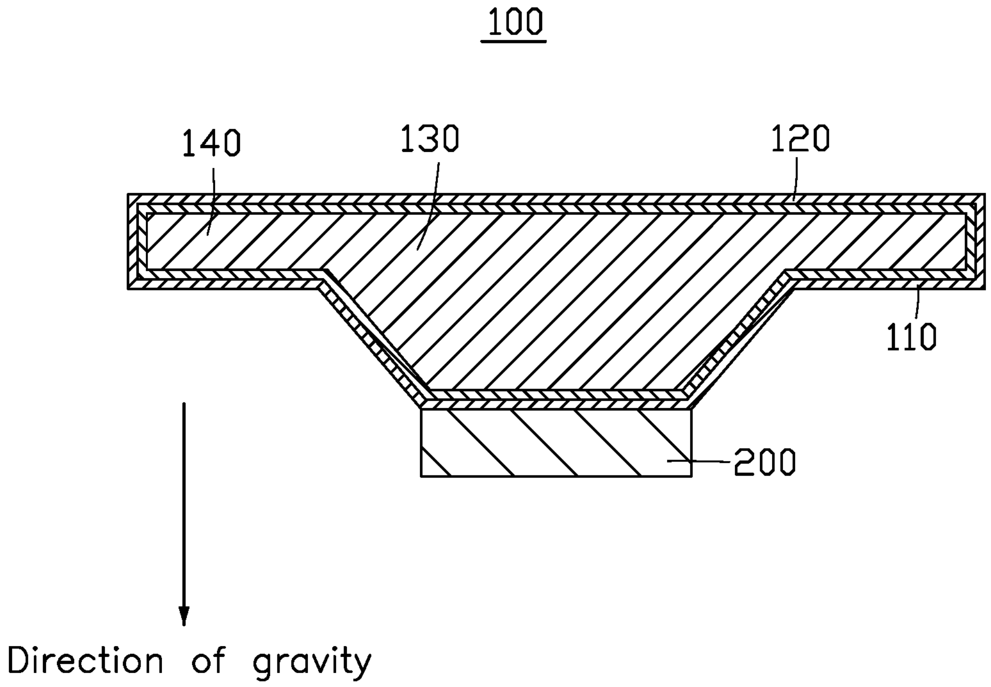
FIG. 1 is a structure diagram of a uniform temperature plate in one embodiment of the present application.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure. It should be noted that references to “an” or “one” embodiment in this disclosure are not necessarily to the same embodiment, and such references mean “at least one”.

Several definitions that apply throughout this disclosure will now be presented.

The term “coupled” is defined as connected, whether directly or indirectly through intervening components, and is not necessarily limited to physical connections. The connection can be such that the objects are permanently connected or releasably connected. The term “comprising,” when utilized, means “including, but not necessarily limited to”; it specifically indicates open-ended inclusion or membership in the so-described combination, group, series, and the like.

FIG. 1 is a structure diagram of a uniform temperature plate 100 in one embodiment of the present application. The uniform temperature plate 100 includes a first plate 110, a second plate 120, and a braided wire 130. The second plate 120 is enclosed with the first plate 110 to form a containing cavity 140. The containing cavity 140 is filled with working liquid. The containing cavity 140 has an evaporation zone 141 and a condensation zone 142. The braided wire 130 has a capillary structure is arranged in the containing cavity 140. A first end of the braided wire 130 is arranged in the evaporation zone 141. A second end of the braided wire 130 is arranged in the condensation zone 142.

In one embodiment, the braided wire 130 can include a plurality of intertwined metal wires, such as copper, copper alloy, aluminum, aluminum alloy, titanium, titanium alloy, magnesium alloy, stainless steel material, etc. The plurality of metal wires are intertwined to form a plurality of capillary structures, increasing a capillary force of the braided wire 130. The working liquid in the condensation zone 142, or the working liquid between the condensation zone 142 and the evaporation zone 141 can be drained back to the evaporation zone 141, avoiding an accumulation of the working liquid, thereby improving a thermal response and a temperature uniformization performance of the uniform temperature plate 100. Furthermore, the structure formed by the plurality of intertwined metal wires can be more stable, and is not easy to spread or collapse, which can effectively support the capillary structure and ensure the stability of the uniform temperature plate 100. Among them, the working liquid can be selected from a group of water, methanol, and ethanol.

In one embodiment, the containing cavity is configured to be vacuum.

The working liquid has a low boiling point in a vacuum. When the heat is transferred from a heat source to the evaporation zone 141, the working liquid in the vacuum cavity begins to vaporize after being heated in the vacuum environment. The working liquid absorbs heat energy and rapidly vaporizes and expands, and the gaseous working medium quickly fills the entire vacuum cavity. The gaseous working medium will condense to the working liquid when contacting a relatively cold region in the condensation zone, and the heat accumulated during evaporation will be released through the condensation phenomenon. The condensed working liquid will return to the evaporation zone 141 through the capillary structure of the braided wire 130. In this way, the evaporation and condensation of the working liquid can be carried out repeatedly in the vacuum cavity to achieve the temperature uniformization performance of the temperature uniform plate 100.

Figure 2:
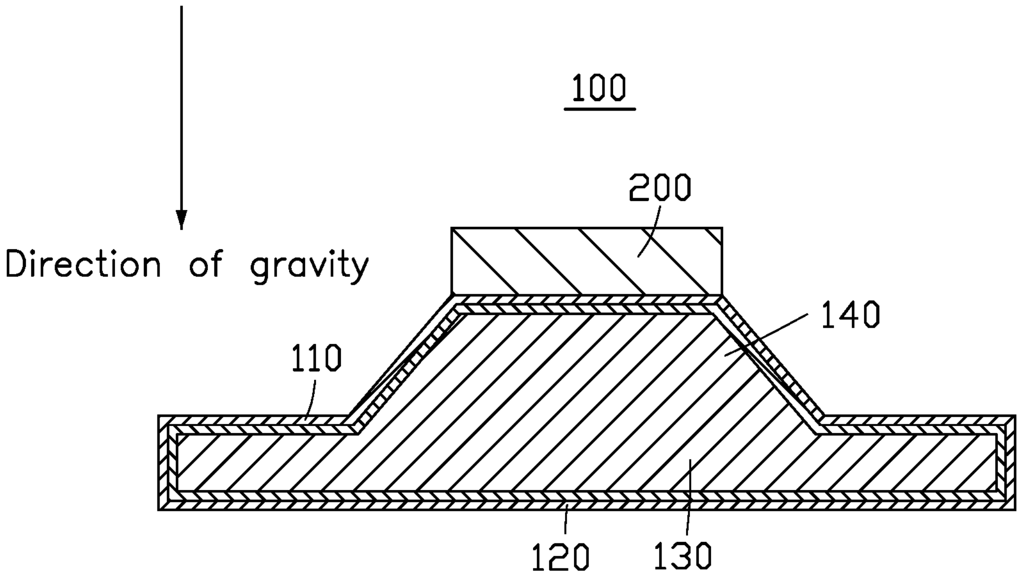
FIG. 2 is a structure diagram of the uniform temperature plate in another embodiment of the present application.
Figure 3:
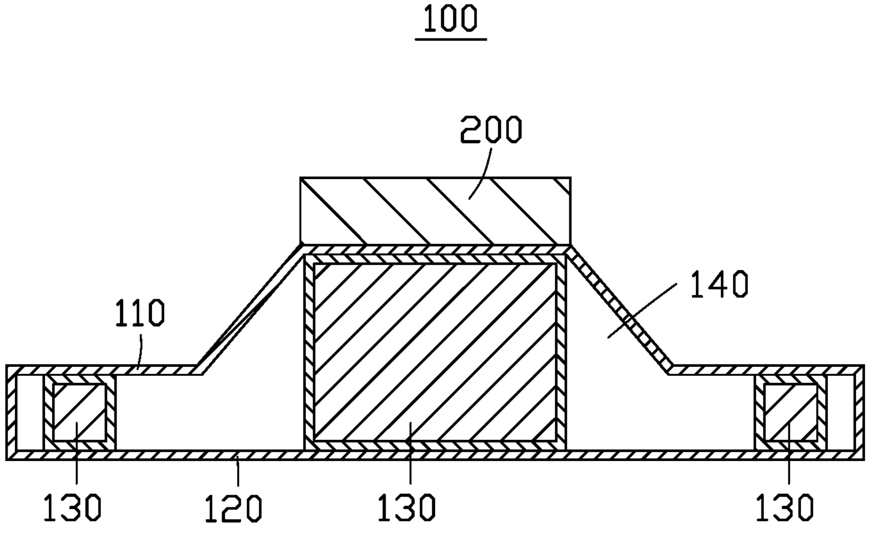
FIG. 3 is a structure diagram of the uniform temperature plate in another embodiment of the present application.

As shown in FIG. 1~FIG. 2, in one embodiment, the braided wire 130 can be arranged in the vacuum cavity parallel to the first plate 110. For example, the braided wire 130 can be parallel to a first side of the first plate 110, or arranged along a diagonal of the first plate 110, etc. The number of braided threads 130 can be multiple.

As shown in FIG. 1, in one embodiment, the first plate 110 is arranged near the heating element 200. The uniform temperature plate 100 is arranged perpendicular to the direction of gravity, and the first plate 110 is in a lower position of the uniform temperature plate 100. When heated by the heating element 200, the working liquid in the uniform temperature plate 100 can vaporize to the gaseous working medium and fills the entire vacuum cavity. The gaseous working medium will re-condensed into the working liquid near the second plate 120. Since the gaseous working medium fills the entire vacuum chamber, it may be re-condensed into the working liquid at any position of the vacuum chamber or at any position of the second plate 120 and fall on the first plate 110. At this time, the braided wire 130 can direct the working liquid that is far away from the evaporation zone 141 (e.g. corner, edge zone) to the evaporation zone 141. The heating element 200 can be an electronic component that generates heat easily, for example, a processing chip, a switch tube, etc.

As shown in FIG. 2, in one embodiment, the first plate 110 is arranged near the heating element 200. The uniform temperature plate 100 is arranged perpendicular to the direction of gravity, and the first plate 110 is in a higher position of the uniform temperature plate 100. When heated by the heating element 200, the working liquid in the uniform temperature plate 100 can vaporize to the gaseous working medium and fills the entire vacuum cavity. The gaseous working medium will re-condensed into the working liquid near the second plate 120. Since the gaseous working medium fills the entire vacuum chamber, it may be re-condensed into the working liquid at any position of the vacuum chamber or at any position of the second plate 120 and fall on the second plate 120. At this time, the braided wire 130 can direct the working liquid on the second plate 120 to the evaporation zone 141.

Figure 4:
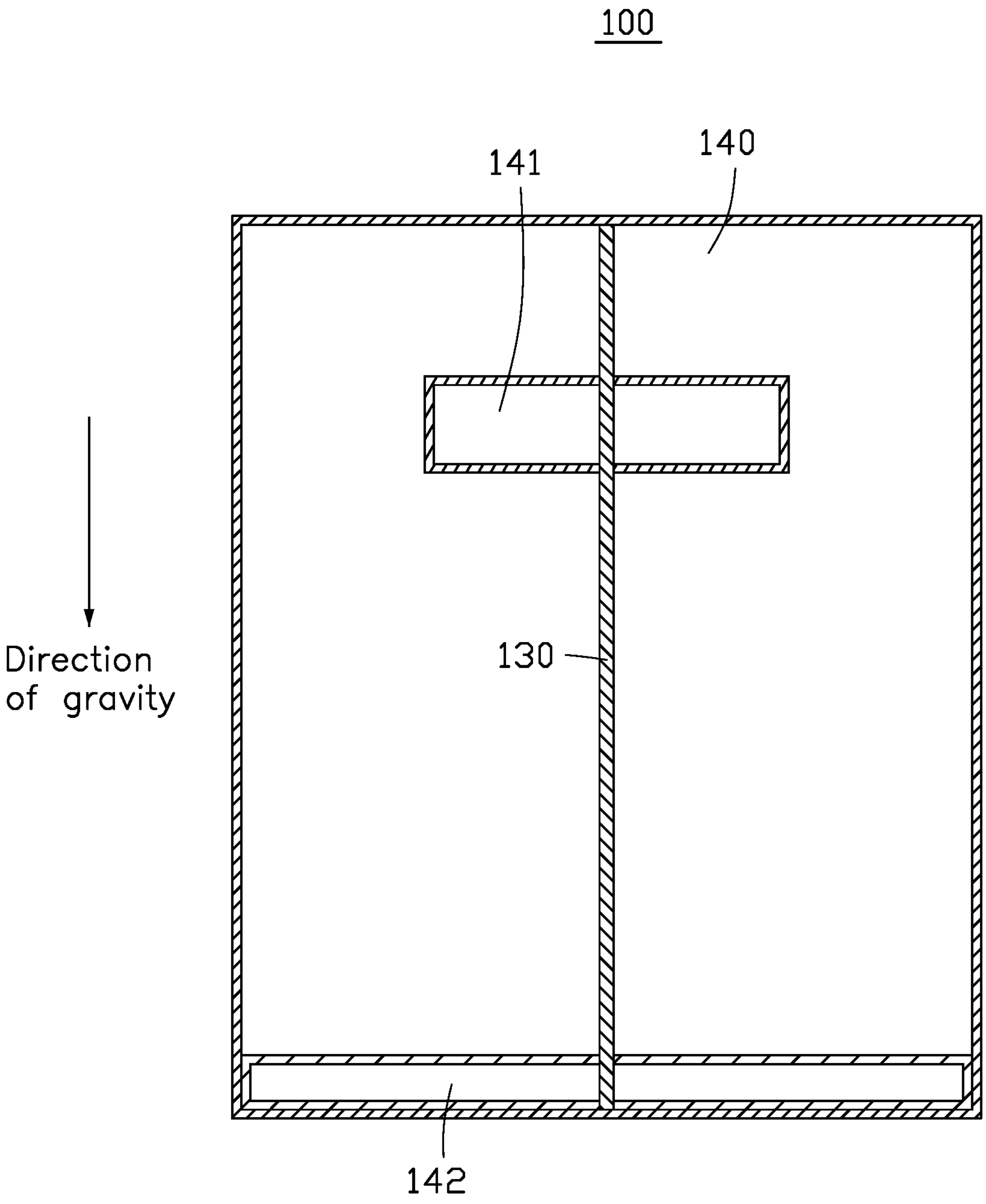
FIG. 4 is a structure diagram of the uniform temperature plate in another embodiment of the present application.

As shown in FIG. 4, in one embodiment, the first plate 110 is arranged near the heating element 200. The uniform temperature plate 100 is arranged parallel to the direction of gravity. When heated by the heating element 200, the working liquid in the uniform temperature plate 100 can vaporize to the gaseous working medium and fills the entire vacuum cavity. The gaseous working medium will re-condensed into the working liquid near the second plate 120, and the working liquid will fall in the lower condensation zone 142 under the gravity. At this time, the braided wire 130 can direct the working liquid in the condensation zone 142 to the higher evaporation zone 141.

Figure 5:
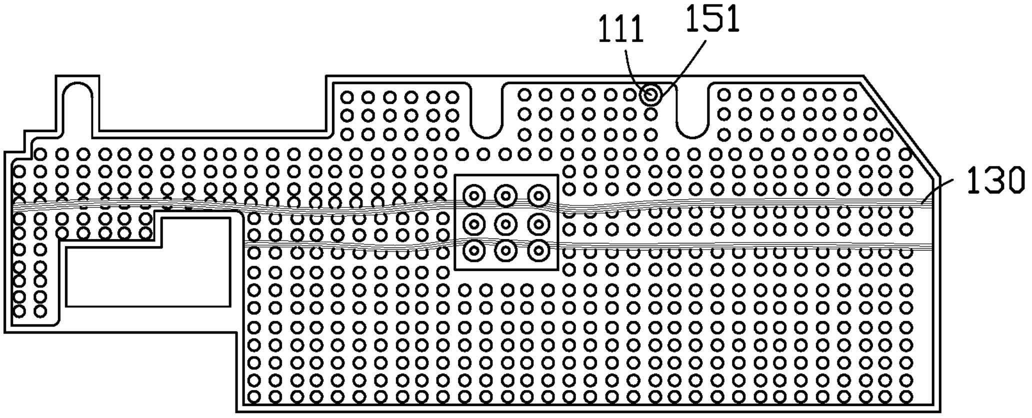
FIG. 5 is a structure diagram of the uniform temperature plate in another embodiment of the present application.
Figure 6:
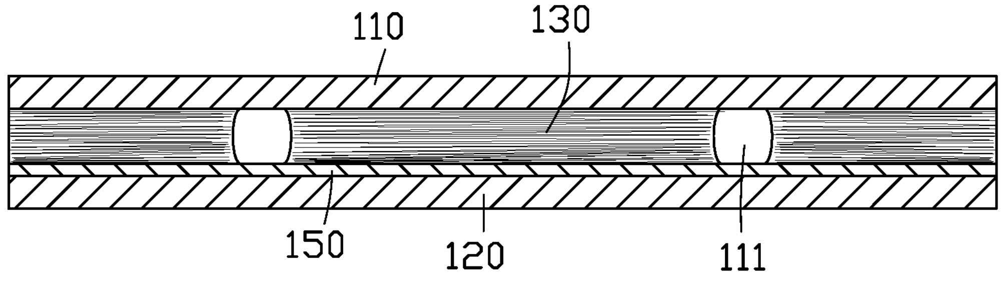
FIG. 6 is a section view diagram of the uniform temperature plate according to one embodiment of the present disclosure.

Referring to FIGS. 5 and 6, in one embodiment, the first plate 110 includes a plurality of first convexes 111 in the direction face to the containing cavity 140.

The working liquid formed by re-condensation can flow along the plurality of first convexes 111 to the braided wire 130 or the first plate 110, and then return to the evaporation zone 141 under the guidance of the braided line 130. Furthermore, the plurality of first convexes 111 can be arranged to contact the second plate 120. In this way, the plurality of first convexes 111 can play a support role between the first plate 110 and the second plate 120 to ensure that the working liquid and the gaseous working medium have enough transmission channels.

In one embodiment, the uniform temperature plate 100 further includes a capillary structure layer 150. The capillary structure layer 150 is arranged on the first plate 110 or on the second plate 120. The working liquid formed by re-condensation can also flow back to the evaporation zone 141 along the capillary structure layer 150, to improve the temperature uniformization performance of the uniform temperature plate 100. Among them, the capillary structure layer 150 can be made of metal materials, such as copper mesh, copper powder, etc.

In one embodiment, the capillary structure layer 150 includes a plurality of round holes 151. A position of each of the plurality of round holes 151 is arranged corresponding to a position of each of the plurality of the first convexes 111. So that the plurality of the first convexes 111 can fit into the plurality of round holes 151. The re-condensation working liquid can also flow back to the evaporation zone 141 under the cooperation of the capillary structure layer 150, the plurality of the first convexes 111, and the braided wire 130.

In one embodiment, the first plate 110 includes a second convexes in a direction away from the containing cavity 140. A position of the second convexes is arranged corresponding to a heating element 200. So that the heat emitted by the heating element 200 can be quickly transmitted to the vacuum cavity, and improve the temperature uniformization efficiency of the uniform temperature plate 100.

Figure 7:
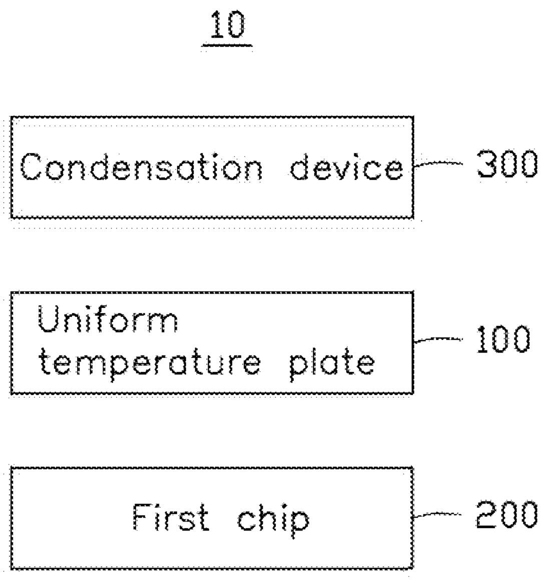
FIG. 7 is a block diagram of an electronic equipment in one embodiment of the present application.

FIG. 7 is a block diagram of an electronic equipment 10 in one embodiment of the present application. The electronic equipment 10 includes a first chip 200 and a uniform temperature plate 100. The first chip is arranged close to a first surface of the uniform temperature plate 100. The uniform temperature plate 100 can absorb the heat emitted by the first chip 200, and keep the first chip 200 at a constant operating temperature, so that the first chip 200 can keep good performance.

In one embodiment, the electronic equipment 10 further includes a condensation device 300. The condensation device 300 is arranged close to a second surface of the uniform temperature plate 100. In the uniform temperature plate 100, the first surface is arranged relative to the second surface. The condensation device 300 can comprise a fan. The first surface of the uniform temperature plate 100 is close to the first chip 200 which is easy to heat, and the second surface is close to the condensation device 300 to increase the cold and hot temperature difference between the first surface and the second surface, so that the working liquid can quickly evaporate and cool, and improve the temperature uniformization performance of the uniform temperature plate 100.

The exemplary embodiments shown and described above are only examples. Many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. A uniform temperature plate comprising:

a first plate;

a second plate enclosed with the first plate to form a containing cavity, wherein the containing cavity is filled with working liquid, the containing cavity comprises an evaporation zone and a condensation zone;

a braided wire having a capillary structure, wherein the braided wire comprises a plurality of intertwined metal wires, the braided wire is arranged in the containing cavity, a first end of the braided wire is arranged in the evaporation zone, a second end of the braided wire is arranged in the condensation zone; and a capillary structure layer, arranged on the first plate or on the second plate, the capillary structure layer comprising a plurality of round holes;

wherein the first plate comprises a plurality of first convexes in a direction facing the containing cavity, positions of the plurality of round holes are arranged corresponding to positions of the plurality of first convexes.

2. The uniform temperature plate of claim 1, wherein the plurality of metal wires is made of copper.

3. The uniform temperature plate of claim 1, wherein the containing cavity is configured to be vacuum.

4. An electronic equipment comprising a first chip and a uniform temperature plate, wherein the first chip is arranged close to a first surface of the uniform temperature plate, the uniform temperature plate comprises:

a first plate;

a second plate enclosed with the first plate to form a containing cavity, wherein the containing cavity is filled with working liquid, the containing cavity comprises an evaporation zone and a condensation zone;

a braided wire having a capillary structure, wherein the braided wire comprises a plurality of intertwined metal wires, the braided wire is arranged in the containing cavity, a first end of the braided wire is arranged in the evaporation zone, a second end of the braided wire is arranged in the condensation zone; and a capillary structure layer, arranged on the first plate or on the second plate, the capillary structure layer comprising a plurality of round holes;

wherein the first plate comprises a plurality of first convexes in a direction facing the containing cavity, positions of the plurality of round holes are arranged corresponding to positions of the plurality of first convexes.

5. The electronic equipment of claim 4, wherein the plurality of metal wires is made of copper.

6. The electronic equipment of claim 4, wherein the containing cavity is configured to be vacuum.

7. The electronic equipment of claim 4, further comprising a condensation device, wherein the condensation device is arranged close to a second surface of the uniform temperature plate, the first surface is arranged relative to the second surface.

* * * * *